United States Patent [19]

Arakawa et al.

[11] Patent Number: 5,864,943
[45] Date of Patent: Feb. 2, 1999

[54] IC MOUNTING/DEMOUNTING SYSTEM AND MOUNTING/DEMOUNTING HEAD THEREFOR

[75] Inventors: Isao Arakawa; Yoshinori Hirata, both of Kumamoto, Japan

[73] Assignee: Mitsubishi Denki Kabushiki Kaisha, Tokyo, Japan

[21] Appl. No.: 899,136

[22] Filed: Jul. 23, 1997

[30] Foreign Application Priority Data

Dec. 2, 1996 [JP] Japan .................................. 8-321748

[51] Int. Cl.⁶ ...................................................... B23P 19/00
[52] U.S. Cl. ............................... 29/740; 29/743; 29/760; 29/DIG. 44; 294/65; 901/40
[58] Field of Search ............................ 29/739, 740, 743, 29/760, 762, DIG. 44; 901/40; 294/65

[56] References Cited

U.S. PATENT DOCUMENTS

| | | | |
|---|---|---|---|
| 4,770,599 | 9/1988 | Hawkswell | 29/740 |
| 4,790,053 | 12/1988 | Godbecker | 29/739 X |
| 4,810,018 | 3/1989 | Van De Ven et al. | 29/740 X |
| 4,843,711 | 7/1989 | Rager | 29/740 |
| 5,165,165 | 11/1992 | Aoki et al. | 29/741 X |
| 5,195,235 | 3/1993 | Mifuji | 29/721 |
| 5,342,460 | 8/1994 | Hidese | 29/740 X |

*Primary Examiner*—S. Thomas Hughes
*Assistant Examiner*—Rick Kiltae Chang
*Attorney, Agent, or Firm*—Leydig, Voit & Mayer

[57] ABSTRACT

An IC mounting/demounting system comprising a centering unit including first and second centering tools where socket pushers are constructed integrally with centering recess portions respectively. The centering unit is detachably fitted to a head body and replaceable with a centering unit corresponding to an IC having a different size. Accordingly, the replacement of the whole mounting/demounting head that normally accompanies the change in the kind of IC becomes unnecessary, thus enhancing work efficiency.

5 Claims, 16 Drawing Sheets

IC MOUNTING/DEMOUNTING SYSTEM AND MOUNTING/DEMOUNTING HEAD THEREFOR

BACKGROUND OF THE INVENTION

1. Field of the Invention

The present invention relates to an IC mounting/demounting system for transferring an IC on a tray and mounting the IC on an IC socket on a socket board for a burn-in process or demounting the IC from the IC socket and transferring the IC on the tray.

2. Description of the Related Art

Conventionally, a fabricated IC (IC package) passes through a burn-in process turned on for a predetermined time at a high temperature of, for example, 120° to 130° C. and thereafter, undergoes an electrical operation test. In the burn-in process, an IC is mounted on each of a plurality of IC sockets arranged on a socket board, that is, the IC is electrically connected with the IC socket, and the socket board is set in a burn-in oven. Therefore, a process for transferring an IC to an IC socket on a socket board and mounting/demounting the IC on or from the IC socket is necessary before and after the burn-in process and an IC mounting/demounting system is used for the process.

FIG. 18 is a perspective view showing an example of a conventional IC mounting/demounting system. In the figure, a socket board (burn-in board) 1 on which a plurality of IC sockets (not illustrated) are mounted is transferred one by one from a board magazine 3 by a board transfer section 2. A tray housing section 5 in which a plurality of trays 4 are housed is set nearby the board transfer section 2. A plurality of IC's (not illustrated) are mounted on each tray 4.

The IC's are transferred between the socket board 1 and the tray 4 by a robot body 6. Two mounting/demounting heads 7 for sucking and holding the IC's are mounted on the robot body 6. The interval between these two mounting/demounting heads 7 can be adjusted in accordance with the pitch between the IC sockets on the socket board 1 and the pitch between the IC's housed in the tray 4. Moreover, a tray chuck 8 for transferring the tray 4 is mounted on the robot body 6.

Next, the operation will now be described. For example, to mount the IC's on the tray 4 housed in the tray housing section 5 on the IC sockets on the socket board 1, the mounting/demounting heads 7 are moved onto the IC on the tray 4 by the robot body 6 to suck two IC's. Thereafter, the mounting/demounting heads 7 are moved over the IC sockets on the socket board 1 to mount the IC on the IC sockets and cancel the suction.

In this case, because the IC socket is provided with a cover for opening/closing the contacts, the IC is set to the IC socket by pressing the cover with the mounting/demounting head and thereby opening the contacts. Then, by moving the mounting/demounting head 7 upward, the pressure on the cover is released, the contacts are closed, and the IC is held by the IC socket. Moreover, the IC is positioned in the mounting/demounting head 7 by correcting the shoulder portions of the IC by chucks (not illustrated) from four directions.

Thus, the IC's are mounted by two on the IC sockets on the socket board 1 from the tray 4. When an IC is mounted on every IC socket on the socket board 1, the next socket board 1 is supplied by the board transfer section 2. When all the IC's are removed from the tray 4, a new tray 4 is supplied by the tray chucking section 8.

As described above, a burn-in process is carried out after the socket board with the IC's mounted on the IC sockets is placed in a burn-in oven (not illustrated). After the burn-in process, the IC's on the IC sockets are transferred to the tray 4 by reversing the above procedure.

In the conventional IC mounting/demounting system constructed as described above, since the mounting/demounting head is moved between the socket board 1 and the tray 4, operating efficiency is impaired and transferring the IC's requires much time. Further, it is necessary to position the IC by the chucks and press the cover of the IC socket by socket pushers (not illustrated) of the mounting/demounting head when the IC is mounted and demounted on the IC socket. However, because various sizes of IC sockets are used corresponding to the IC to be mounted, it is necessary to store various mounting/demounting heads having a socket pusher corresponding to each IC socket size and the chucks corresponding to the IC size and to replace the whole of the mounting/demounting head whenever the type of IC and IC socket are changed. To perform the above mounting/demounting head replacement, operations of the system must be stopped for 15 to 20 minutes or more thereby lowering operation efficiency. Particularly, as the number of diversified low-volume products increases, the frequency of mounting/demounting head replacement increases and the time and labor required for the replacement greatly influence operation efficiency.

There is a system for simultaneously transferring a lot of IC's by a robot having a plurality of mounting/demounting heads corresponding to only IC's and IC sockets of specific sizes. However, the system is also unsuitable for the above diversified low-volume product manufacture because the whole system must be stopped while the different size IC's and IC sockets are handled.

SUMMARY OF THE INVENTION

The present invention has been achieved with a view toward solving the problems described above, and it is an object of the present invention to provide an IC mounting/demounting system and an IC mounting/demounting head therefor which is capable of greatly improving the operation efficiency by eliminating the mounting/demounting head replacement time.

To this end, according to one aspect of the present invention, there is provided an IC mounting/demounting system comprising: a tray supply section for supplying a tray bearing a plurality of IC's; a socket board supply section for supplying a socket board having a plurality of IC sockets to and from which the IC's are mounted and demounted by pressing and displacement of a movable section; a robot body for carrying the IC's between the tray supplied to the tray supply section and the socket board supplied to the socket board supply section; a mounting/demounting head including a head body supported by the robot body for absorbing and holding the IC and a centering unit detachably supported by the head body for centering the IC; a centering unit stocker for bearing a plurality of centering units corresponding to the IC's having different sizes; and a control section for controlling an operation of the robot body, wherein the centering unit includes first and second centering tools each having a socket pusher for pressing the movable section and a centering recess portion for centering the IC which are constructed integrally with each other, and wherein a separation between the first and second centering tools is automatically switched between a first separation corresponding to an interval between the IC's on the tray and a second separation corresponding to an interval between the IC's on the socket board.

According to another aspect of the present invention, there is provided an IC mounting/demounting system comprising: a tray supply section for supplying a tray bearing a plurality of IC's; a socket board supply section for supplying a socket board having a plurality of IC sockets; a robot body for transferring the IC's between the tray supplied to the tray supply section and the socket board supplied to the socket board supply section; a mounting/demounting head supported by the robot body for absorbing and holding the IC; a temporary resting stage having an IC supporting section for receiving the IC's in the middle of the transfer between the tray and the socket board; and a control section for controlling an operation of the robot body.

According to a still further aspect of the present invention, there is provided an IC mounting/demounting system comprising a mounting/demounting head including a head body supported by a robot body for absorbing an IC and a centering unit detachably supported by the head body for centering the IC, wherein the centering unit is equipped with first and second centering tools each having a socket pusher for pressing a movable section of an IC socket at mounting and demounting of the IC to and from the IC socket and a centering recess portion for centering the IC, which are constructed integrally with each other, and a separation between the first and second centering tools is switched between a first separation corresponding to an interval between IC's on a tray for bearing a plurality of IC's and a second separation corresponding to an interval between IC's on a socket board.

DESCRIPTION OF THE PREFERRED EMBODIMENTS

Figure 1:
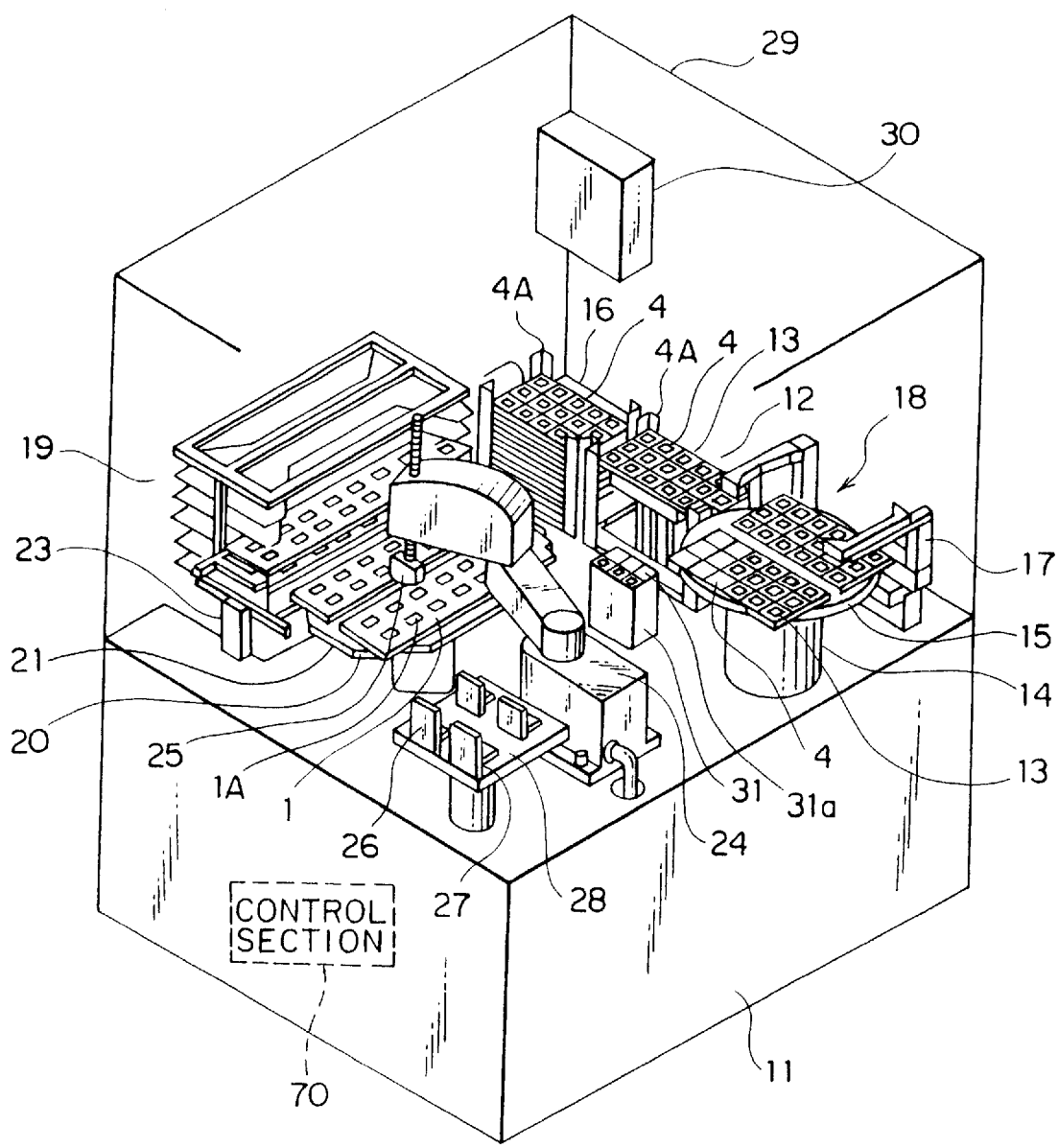
FIG. 1 is a perspective view showing an IC mounting/demounting system according to a first embodiment of the present invention.
Figure 2:
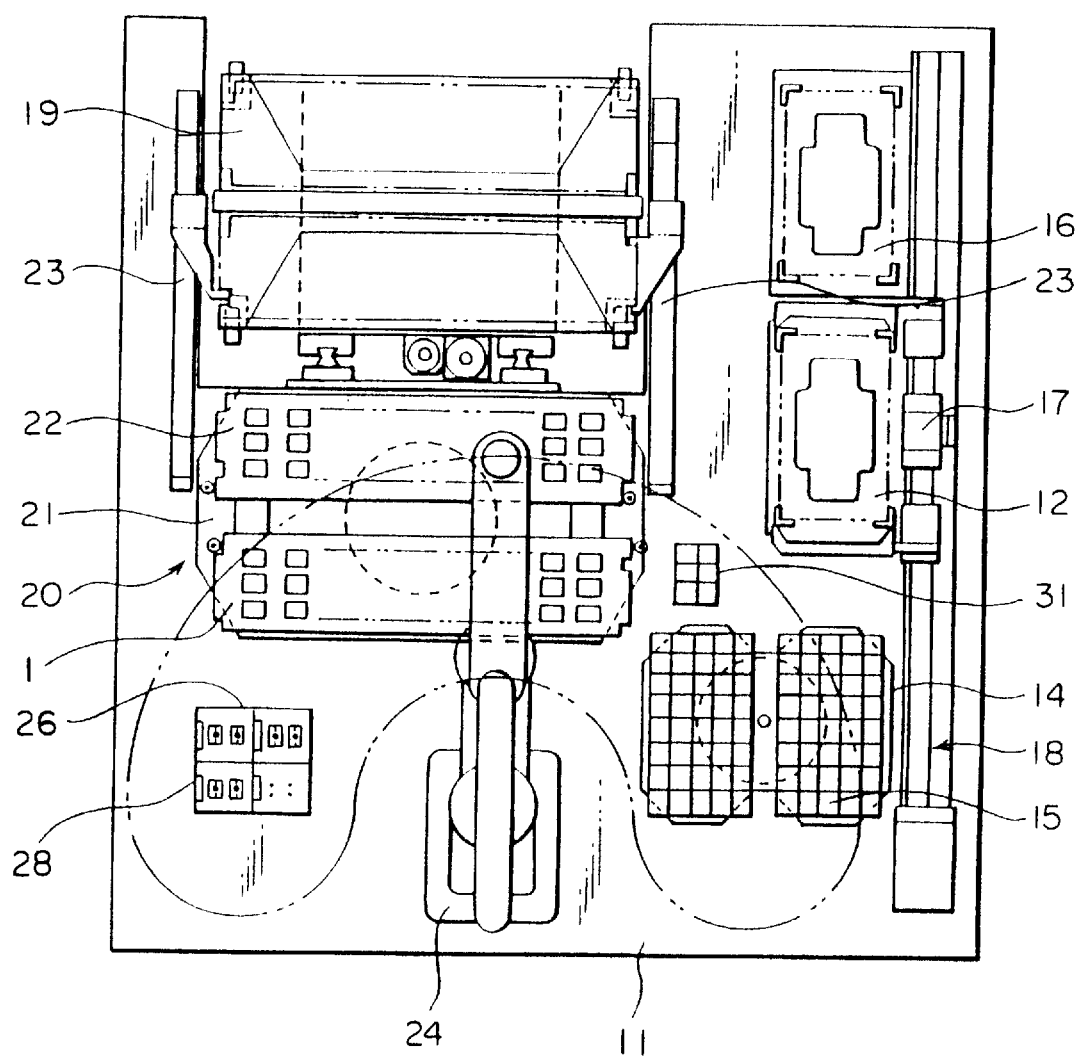
FIG. 2 is a plan view showing the FIG. 1 system.

Embodiments of the present invention will be described hereinbelow with reference to the drawings. FIG. 1 is a perspective view showing an IC mounting/demounting system according to an embodiment of this invention, and FIG. 2 is a plan view showing the FIG. 1 system. On an installation base 11, there are placed two tray lifting devices 12, 16 for gradually lifting and supplying a plurality of trays 4 piled up. Each of the trays 4 is structurally made to position and bear a plurality of IC's (IC package) 13.

A tray table 14 to which the trays 4 are transferred from the tray lifting device 12 or 16 is provided to be adjacent to one side of the tray lifting device 12. This tray table 14 is equipped with a tray bearer 15 rotatable and made to support two trays 4, and the two trays 4 on the tray bearer 15 are interchangeable in position in a manner that the tray bearer 15 is rotated by 180 degrees. A tray conveying device 17 takes charge of the transportation of the trays 4 between the tray lifting devices 12, 16 and the tray table 14. Further, the tray lifting devices 12, 16, the tray table 14 and the tray conveying device 17 constitute a tray supply section 18.

A socket board rack 19, accommodating a plurality of socket boards (burn-in socket boards) 1 so that they are liftable, is joined at a given position on the installation base 11. In addition, provided on the installation base 11 is a socket board table 20 serving as a socket board supply section. This socket board table 20 is provided with a socket board bearer 21 rotatable and made to bear two socket boards 1, and the two socket boards on the socket board bearer 21 are interchangeable in position by the rotation of the socket board bearer 21 by 180 degrees. A socket board conveying device 23 on the installation base 11 carries out the transportation of the socket boards 1 between the socket board rack 19 and the socket board table 20.

Furthermore, provided on the installation 11 is a robot body 24 which transfers the IC's 13 between the tray 4 on the tray table 14 and the socket board on the socket board table 20. This robot body 24 supports a mounting/demounting head (two-shaft head) 25 for simultaneously sucking and holding two IC's 13 so that it is movable vertically. Moreover, within the operating range of the mounting/demounting head 25 due as limited by the robot body 24, there is provided a centering unit stocker 28 for supporting centering units 27 to be mounted on the mounting/demounting head 25. Placed on this centering unit stocker 28 are a plurality of centering units 27 corresponding to different size IC's 13 and further, at every storage place of each centering unit 27, planted thereon is a center positioning member 26.

A control panel 30 is fixedly secured to a transparent cover 29 situated on the installation base 11. The installation base 11 accommodates a control section 70 having a sequence controller to control the operation of the entire system, and the control panel 30 is connected with this control section 70. Further, a temporary resting stage 31 for bearing the IC's 13 is located on the installation base 11.

Next, a description of a basic operation of the entire system will follow. First of all, a tray magazine 4A accommodating a plurality of trays 4 piled up and carrying the IC's 13 before the burn-in test is put on the tray lifting device 12, and the socket board rack 19 accommodating a plurality of socket boards 1 after the burn-in test are joined at a given position.

Thereafter, the system operation is started by operating the control panel 30. With the tray lifting device 12, the trays 4 within the tray magazine 4A are gradually lifted so that the uppermost tray 4 is conveyed by the tray conveying device 17 to the tray bearer 15 of the tray table 14. After this, the tray table 14 rotates half way so that the tray table 14 can accept the next tray 4. In a similar way, two socket boards 1 are transferred from the socket board rack 19 onto the socket board table 20.

In this state, the mounting/demounting head 25 is shifted by the robot body 24 to be above the socket board 1 on the socket board table 20, and two IC's 13 are extracted by the mounting/demounting head 25. The initially extracted two IC's 13 are carried to the temporary resting stage 31 and then released there. On the temporary resting stage 31, there are provided a plurality of IC supporting sections 31a corresponding to IC's 13 having different sizes. The IC supporting section 31a corresponding to the IC 13 being handled is automatically selected and the IC 13 is placed thereon. Then, the mounting/demounting head 25 is shifted to above the tray 4 on the tray table 14 to be absorb two IC's 13 before the test.

Subsequently, the mounting/demounting head 25 is moved above the socket board 1 on the socket board table 20, and after the extraction of the tested IC 13, the untested IC's 13 are coupled to that vacant IC sockets 1A. Following this, the mounting/demounting head 25 is moved above the same socket board 1 and the next two IC's 13 are pulled out from the IC sockets 1A. These IC's 13 are conveyed to the tray 4 by the movement of the mounting/demounting head 25.

By repeating this operation, the untested IC's 13 are coupled to all the sockets 1 A on the one socket board 1 on the socket board table 20, and then the socket board table 20 rotates half way around and the operation is done for the next socket board 1. Further, while the operating is done for the next socket board 1, the socket board 1 on the socket board table 20 is replaced with the socket board 1 within the socket board rack 19 by the socket board conveying device 23.

When all the IC's 13 on the tray table 14 are interchanged with the tested IC's 13, the tray table 14 is rotated half way so that the operation is started for the next tray 4. Further, during the work for the next tray 4 the tray 4 filled with the tested IC's 13 is transferred to a vacant tray magazine 4A of the tray lifting device 16 by the tray conveying device 17 and a new tray 4 is further conveyed onto the tray table 14, then coming into the waiting condition. After the repetition of this operation, at the load end time the IC's 13 on the temporary resting stage 31 are transferred to the tray 4 on the tray table 14.

Furthermore, when size of the IC 13 to be handled changes the information on the kind of IC 13 is input to the control panel 30 whereupon, the mounting/demounting head 25 is moved above the centering unit stocker 28 and the centering unit 27 is automatically replaced, to match the size of the IC's 13.

Since, as described above the replacement of the socket board 1 by the socket board table 20 and the replacement of the tray 4 by the tray table 14 are instantaneously possible, these replacement operations do not require the system to stop, thus improving working efficiency. In addition, changes of the kind of IC 13 is possible in only a short time because only the centering unit 27 is replaced without having to replace the whole mounting/demounting head 25, thus enhancing the working efficiency accompanying changes in IC type.

Moreover, because of the provision of the temporary resting stage 31, the untested IC 13 on the tray 4 can be replaced with the tested IC 13 on the socket board 1 through one operation, thus further enhancing the working efficiency. Besides, since a plurality of IC supporting sections 31a are provided on the temporary resting stage 31, irrespective of the change in size of the IC 13 the interchange between the untested IC 13 and the tested IC 13 is possible in the same way.

Although in the above-mentioned example the system includes the mounting/demounting head 25 for sucking and holding two IC's 13 at a time, the installation of the temporary resting stage 31 allows easy replacement between the untested IC 13 and the tested IC 13 irrespective of the kind of the mounting/demounting head, which can enhance the working efficiency.

Figure 3:
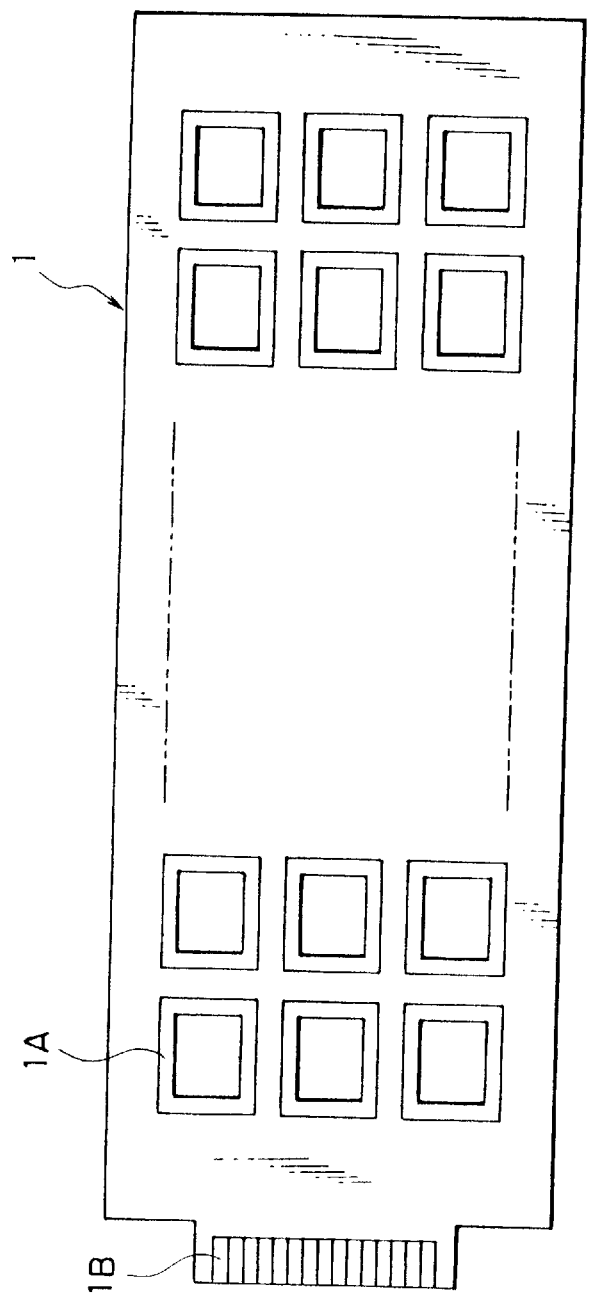
FIG. 3 is a plan view showing one example of socket boards.

Next, a detailed description will follow of the respective sections of the IC mounting/demounting system shown in FIG. 1. FIG. 3 is a plan view showing one example of a socket boards 1. In the illustration, a plurality of IC sockets 1A are arranged on the socket board 1 and further a wiring pattern (not shown) is placed thereon for energizing these IC sockets 1A. In addition, at one end portion of the socket board 1 there is provided a connector 1B which is inserted into a connecting section of a burn-in furnace (not shown) to be electrically coupled thereto.

Figure 4:
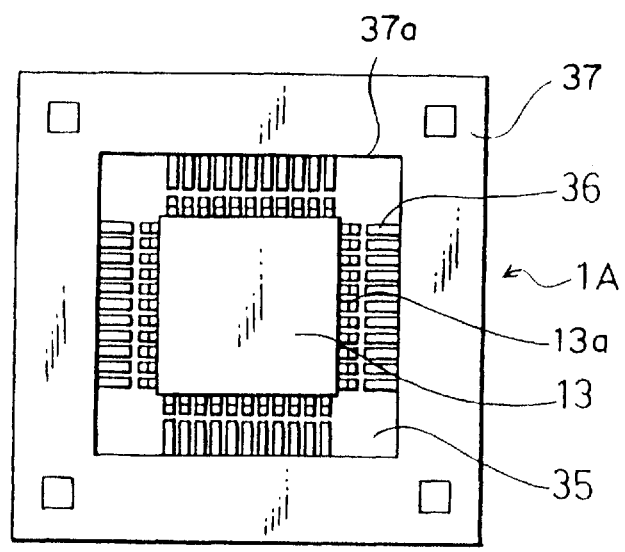
FIG. 4 is a plan view showing one example of IC sockets.
Figure 5:
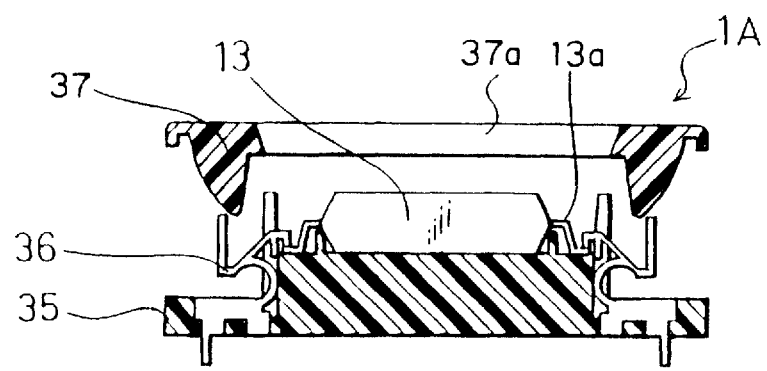
FIG. 5 is a cross-sectional view showing the FIG. 4 IC socket.
Figure 6:
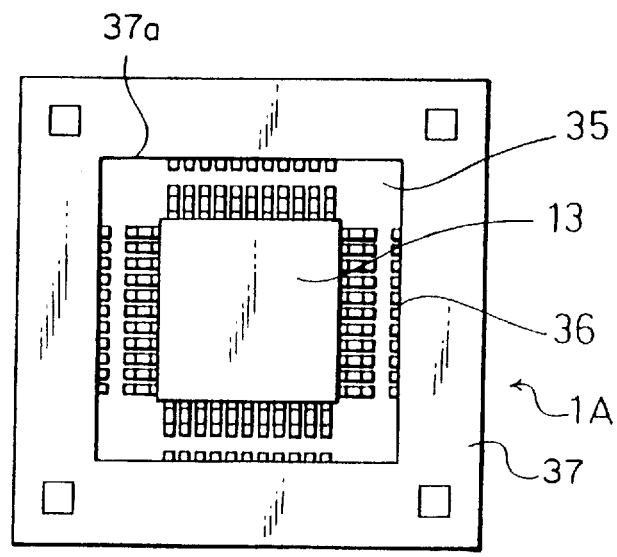
FIG. 6 is a plan view showing a state where the cover shown in FIG. 4 undergoes depression.
Figure 7:
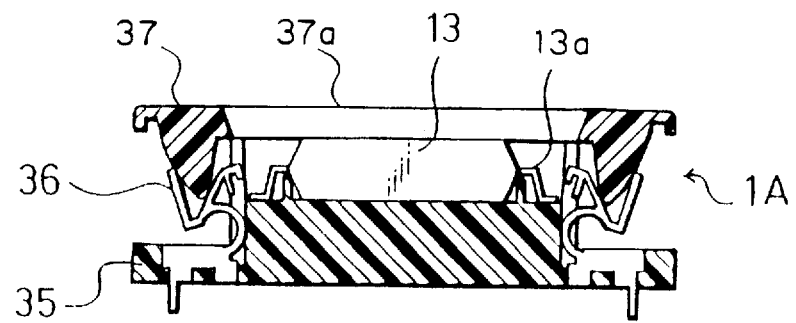
FIG. 7 is a cross-sectional view of the state shown in FIG. 6.

FIG. 4 is a plan view showing one example of IC sockets, FIG. 5 is a cross-sectional view of the FIG. 4 IC socket, FIG. 6 is a plan view showing a state where a cover shown in FIG. 4 is in a pressed condition, and FIG. 7 is a cross-sectional view of the FIG. 6. On a base 35 of the IC socket 1A, a plurality of contact pins 36 elastically deformable are provided in corresponding relation to leads 13a of the IC 13. These contact pins 36 hold down the leads 13a from above by their elastic forces. In addition, provided on the base 35 is a cover 37 serving as a movable section engaged with all the contact pins 36, and an operating 37a is provided in a central portion of the cover 37 to allow the insertion of the IC 13.

In such an IC socket 1A, the cover 37 is evenly pressed by the mounting/demounting head 25 (see FIG. 1) when mounting/demounting the IC 13. So that, all the contact pins 36 are elastically deformed to release the leads 13a as shown in FIG. 7. On releasing the cover 37 from this pressing, the cover 37 moves upwardly, so that the contact pins 36 return to their original shapes and the leads 13a are pressed by the contact pins 36. Accordingly, the leads 13a and the contact pins 36 come into electric connection with each other.

Figure 8:
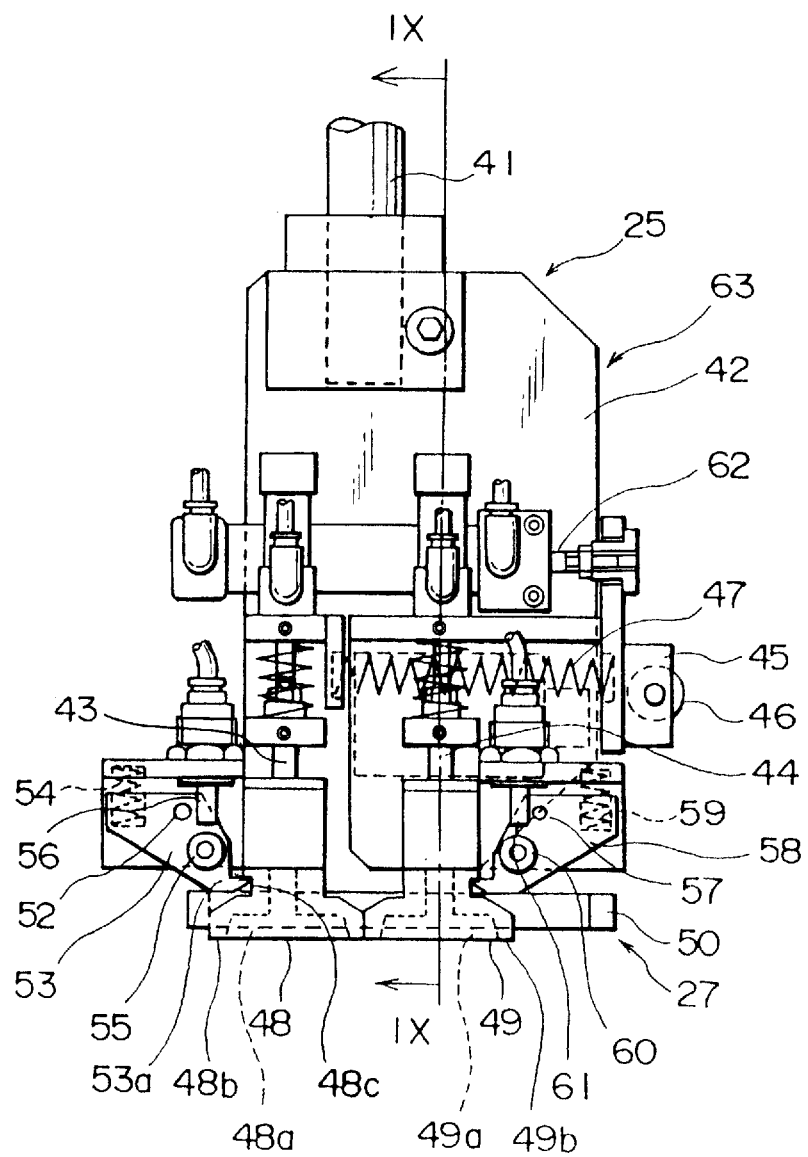
FIG. 8 is a front elevational view showing the FIG. 1 mounting/demounting head.
Figure 9:
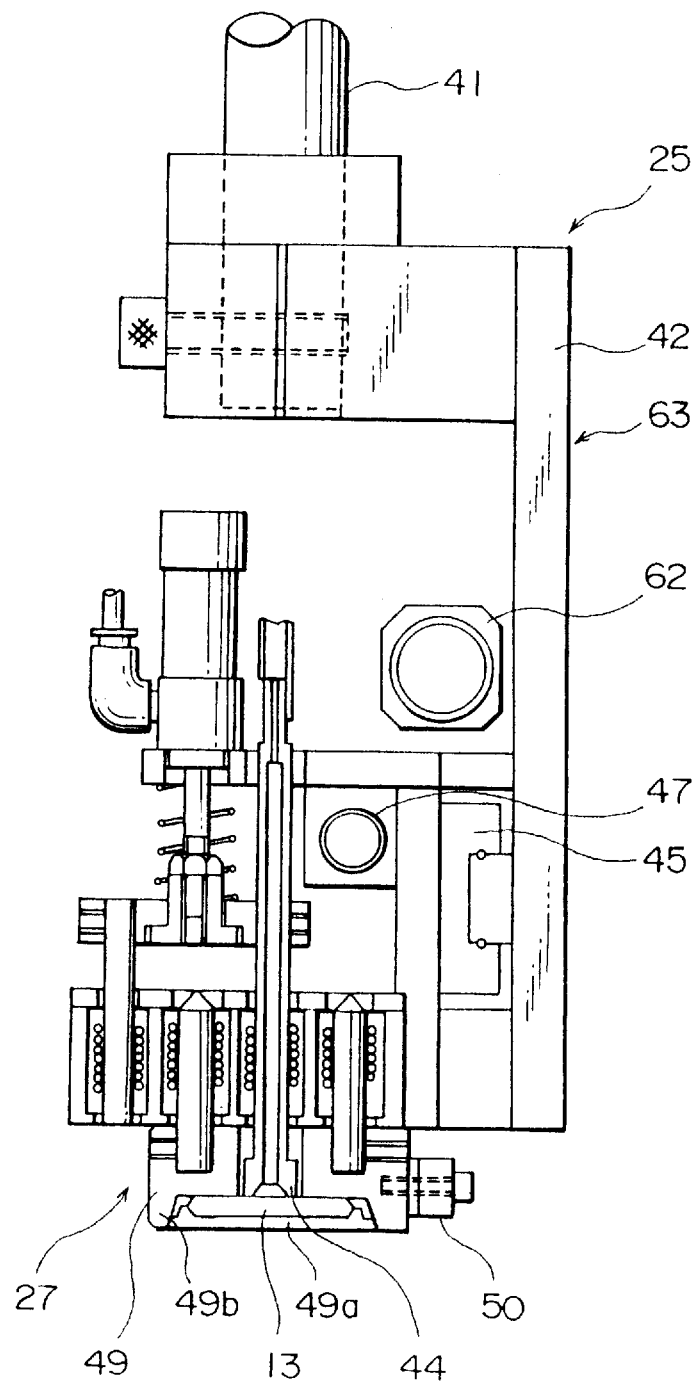
FIG. 9 is a cross-sectional view taken along a line IX—IX of FIG. 8.
Figure 10:
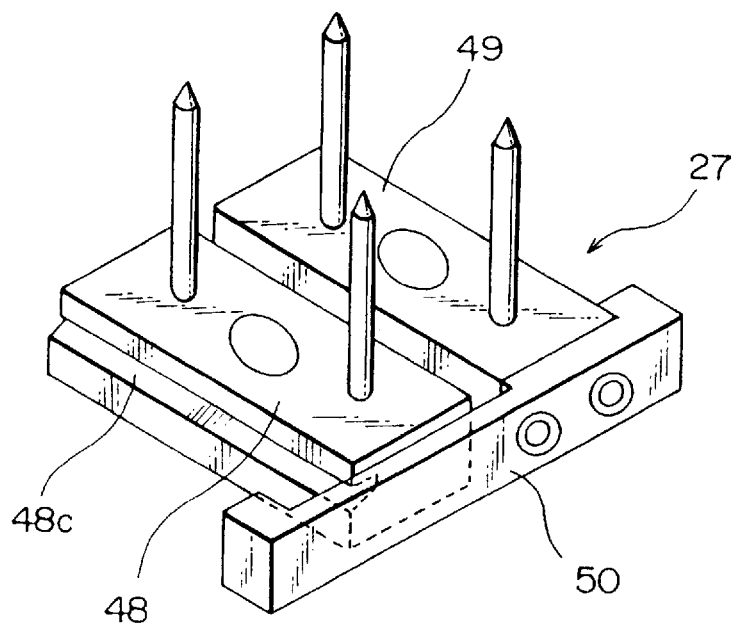
FIG. 10 is a perspective view showing a centering unit of FIG. 8.

Still further, a description will be made hereinbelow of a construction of the mounting/demounting head 25. FIG. 8 is a front elevational view showing the mounting/demounting head 25 of FIG. 1, FIG. 9 is a cross-sectional view taken along a line IX—IX of FIG. 8, and FIG. 10 is a perspective view showing a centering unit 27 of FIG. 8. In the illustrations, a frame 42 is fixedly secured to a lower end portion of a head shaft 41 supported on the robot body 24 to be movable vertically. In addition, two suction spindles 43, 44 for sucking up the IC's 13 are provided on the frame 42.

Placed on the frame 42 is a slide member 45 slidable horizontally in FIG. 8. A roller 46 is provided on one end portion of the slide member 45. Further, the slide member 45 is biased by tool biasing spring 47 in the right direction in FIG. 8. The one absorption spindle 44 is moved together with the slide member 45 horizontally in FIG. 8.

The centering unit 27 is composed of first and second centering tools 48, 49 and a pair of stoppers 50 fixed to the first centering tool 48 for restricting the movement of the second centering tool 49 in a direction of separating from the first centering tool 48. In the centering tools 48, 49, centering recess portions 48a, 49a for centering the IC 13 are integrally constructed with socket pushers 48b, 49b for pressing the cover 37 of the IC socket 1A, respectively.

Attached to a lower end portion of the frame 42 is a lever 53 rotatable about a shaft 52, and provided on the tip portion of the lever 53 is a chuck claw 53a which is made to engage with a recess portion 48c of the first centering tool 48. The lever 53 is biased by a spring 54 in a direction of the chuck claw 53a engaging with the recess portion 48c. A chuck release roller 55 is fitted to the lever 53 to be rotatable. In addition, on the frame 42 there is placed an air cylinder 56 for the rotating the lever 53 against the spring 54 by pressing the chuck release roller 55.

Furthermore, as in the case of the first centering tool 48, on the slide member 45 there are located mechanisms for chucking the second centering tool 49, i.e., a shaft 57, a lever 58, a spring 59, a chuck release roller 60 and an air cylinder 61. Provided on the frame 42 is an air cylinder serving as a drive means to move the slide member 45 against a tool biasing spring 47 in a direction of the second centering tool 49 coming into contact with the first centering tool 48.

In this example, a head body 63 has the frame 42 and parts 43 to 47 and 52 to 62 placed on the frame 42.

Secondly, a description will be taken hereinbelow of an operation of the mounting/demounting head 25. As mentioned before, the mounting/demounting head 25 in this example sucks up and carries two IC's at a time. However, since the disposition intervals of IC's 13 on the socket board 1 and on the tray 4 differ from each other, there is a need to switch the separation between the first and second centering tools 48, 49 when mounting and demounting the IC 13's to and from the socket board 1 or when giving and receiving the IC's 13 to and from the tray 4. Further, in conjunction with this, the change of the separation between suction nozzles 48, 49 also becomes necessary.

Figure 11:
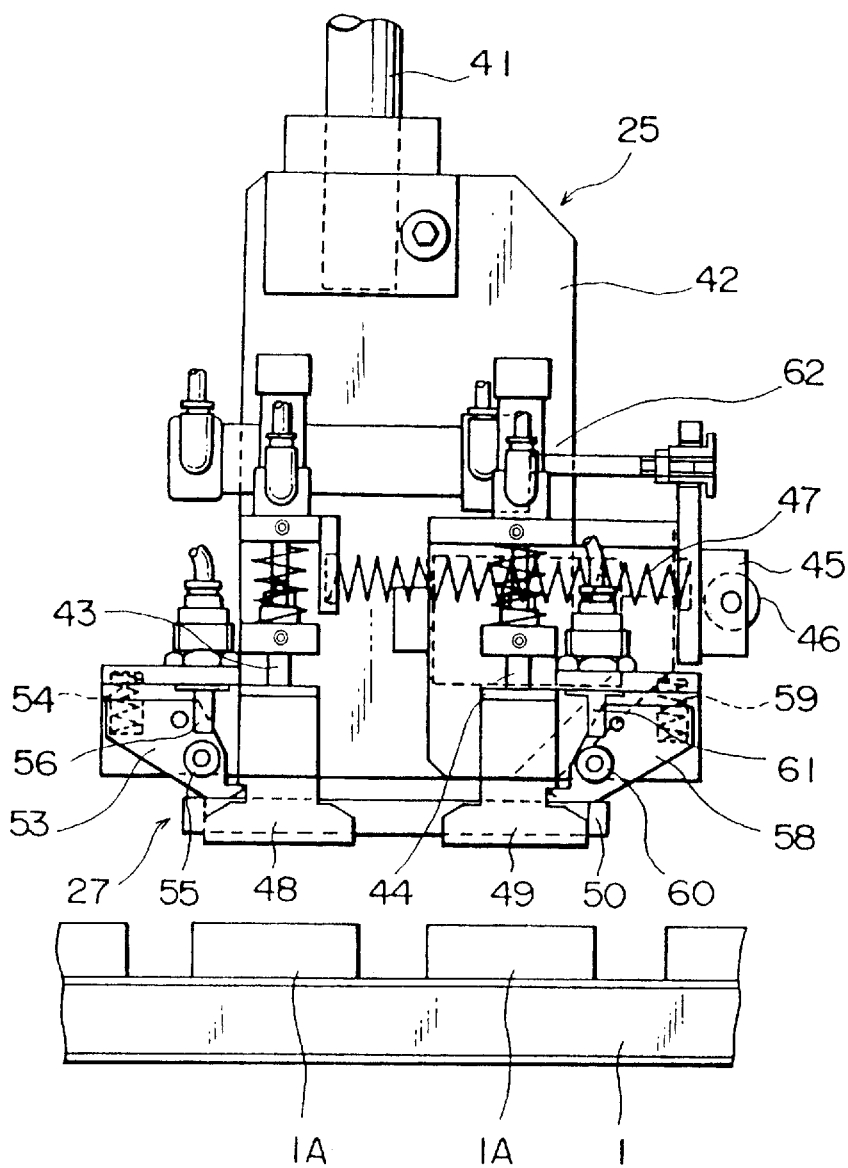
FIG. 11 is a front elevational view showing a state where a separation between first and second centering tools of FIG. 8 are set to a socket board.

During the operation for the socket board 1, as shown in FIG. 11 the slide member 45 is shifted by the tool biasing spring 47 in the right direction in the illustration. At this time, the stoppers 50 restrict the movement of the second centering tool 49. The separation between the first and second centering tools 48, 49 at this time correspond to a first separation of the IC's 13 on the two adjacent IC sockets 1A, and the IC's 13 can be mounted and demounted to and from the IC sockets 1A by just moving the mounting/demounting head 25 vertically.

Figure 12:
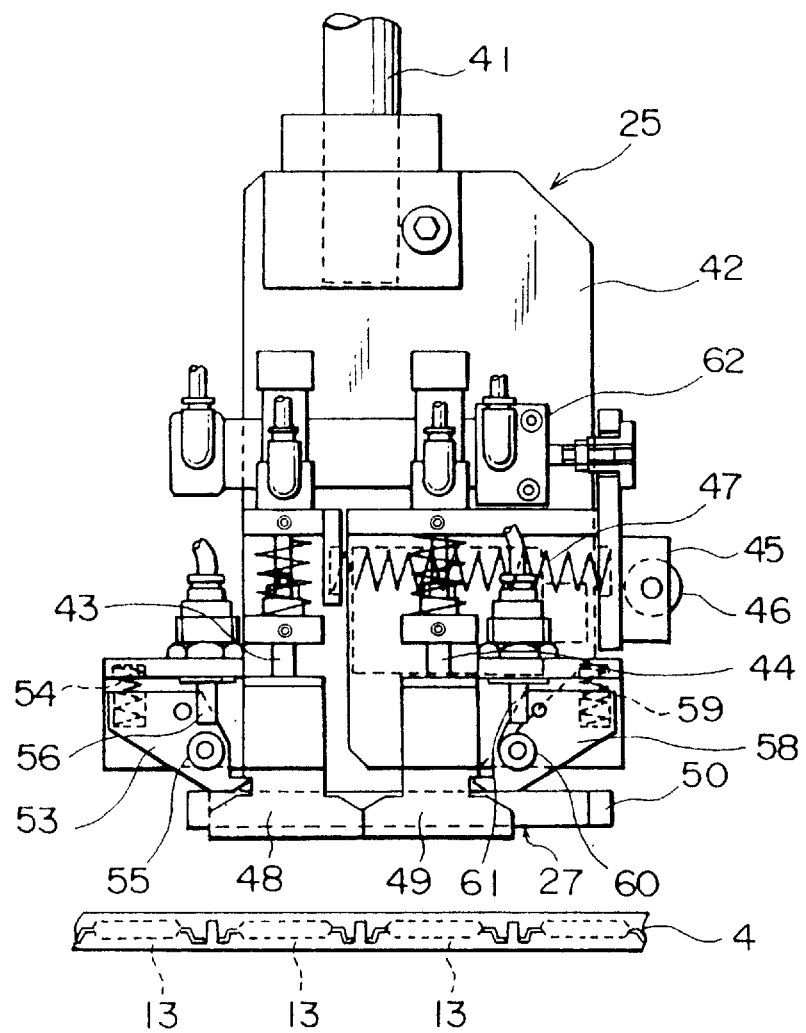
FIG. 12 is a front elevational view showing a state where the separation between the first and second centering tools of FIG. 8 are set to a tray.

Furthermore, at the during operation for the tray 4, as shown in FIG. 12 the slide member 45 is shifted against the tool biasing spring 47 in the left direction in the illustration by the drive of the air cylinder 62 so that the second centering tool 49 is brought into contact with the first centering tool 48. The separation between the first and second centering tools 48, 49, i.e., the contact states thereof, at this time correspond to a second separation between two adjacent IC's 13 on the tray 4, and the IC's 13 can be provided to and received from the tray 4 by moving the mounting/demounting head 25 vertically.

Moreover, side walls of the centering recess portions 48a, 49a have tapered inclination surfaces with which the external leads of the IC 13 come into contact, for example the inclination angle is 15 degrees. Further, side walls of the centering recess portion 27b are mirror finished, so that centering can be smoothly carried out.

Next, a description will be made of the operation of the IC mounting/demounting system when the kind (size) of the IC 13 is changed. First of all, the operator inputs an instruction for the type of changing operation to the control panel 30 in FIG. 1 and further inputs the necessary information including kind of new IC, the IC socket to be used etc. This controls, the robot body 24 to being the mounting/demounting head 25 to the centering unit stocker 28. The memory of the control section 70 is previously stored with the storage positions of the respective centering units 27 on the centering unit stocker 28, and hence the mounting/demounting head 25 is transferred up to the storage position of the centering unit 27 currently located, in accordance with that data.

Figure 13:
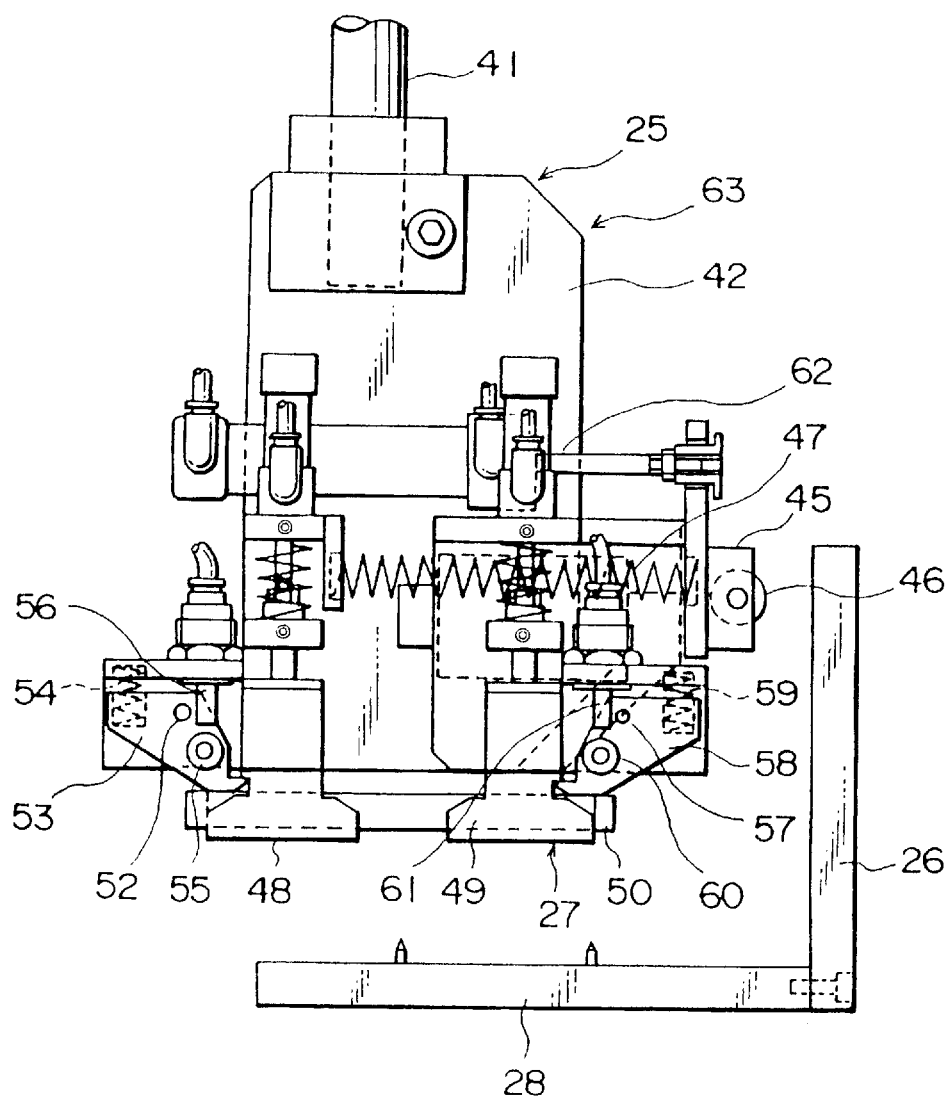
FIG. 13 is a structural view showing an operation for replacing a centering unit by the mounting/demounting head FIG. 8.
Figure 14:
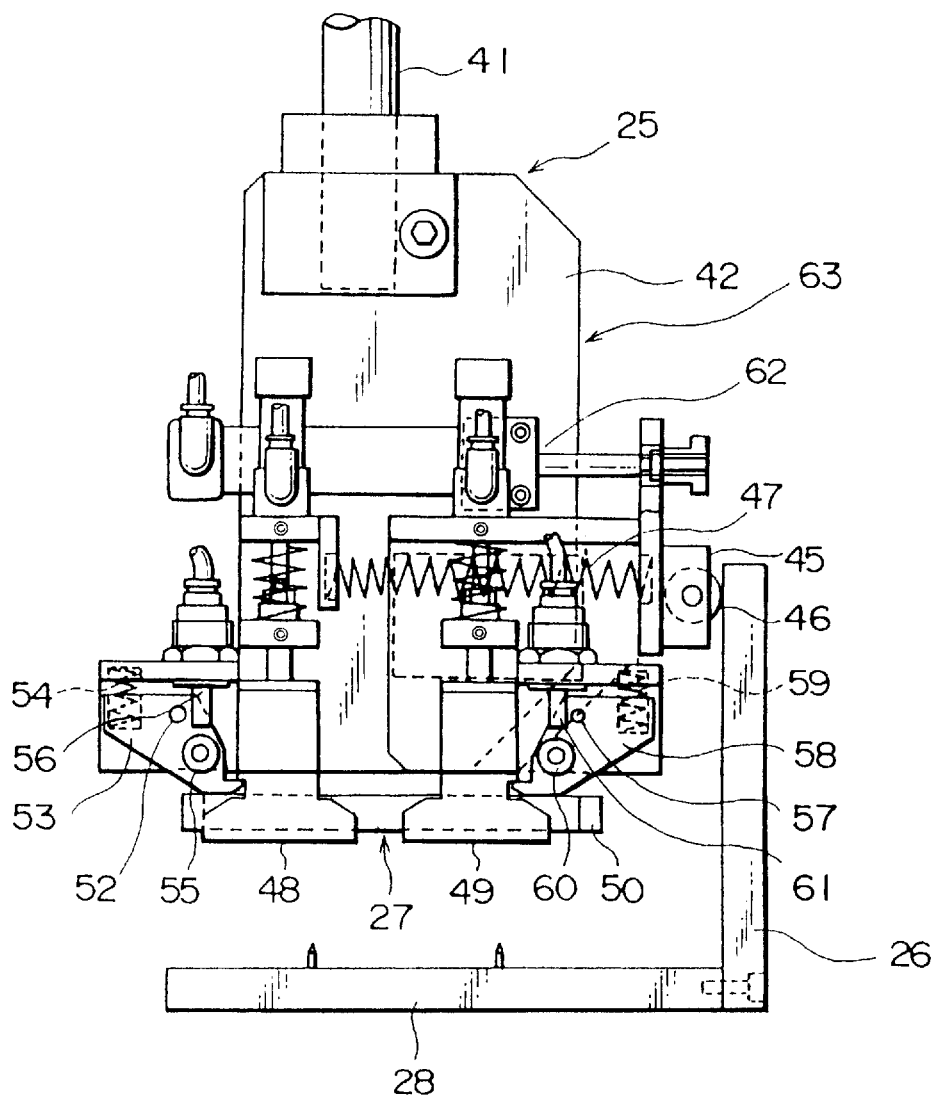
FIG. 14 is a structural view showing a state where the roller of FIG. 13 is pressed against the positioning member.

Moreover, as shown in FIG. 13 the mounting/demounting head 25 is lowered to a height at which the roller 46 faces the positioning member 26. Subsequently, the roller 46 is pressed against the positioning member 26 by the movement of the mounting/demounting head 25, and the slide member 45 is shifted by a predetermined distance against the tool biasing spring 47. Thus, the separation between the first and second centering tools 48, 49 be comes that used for storage.

Figure 15:
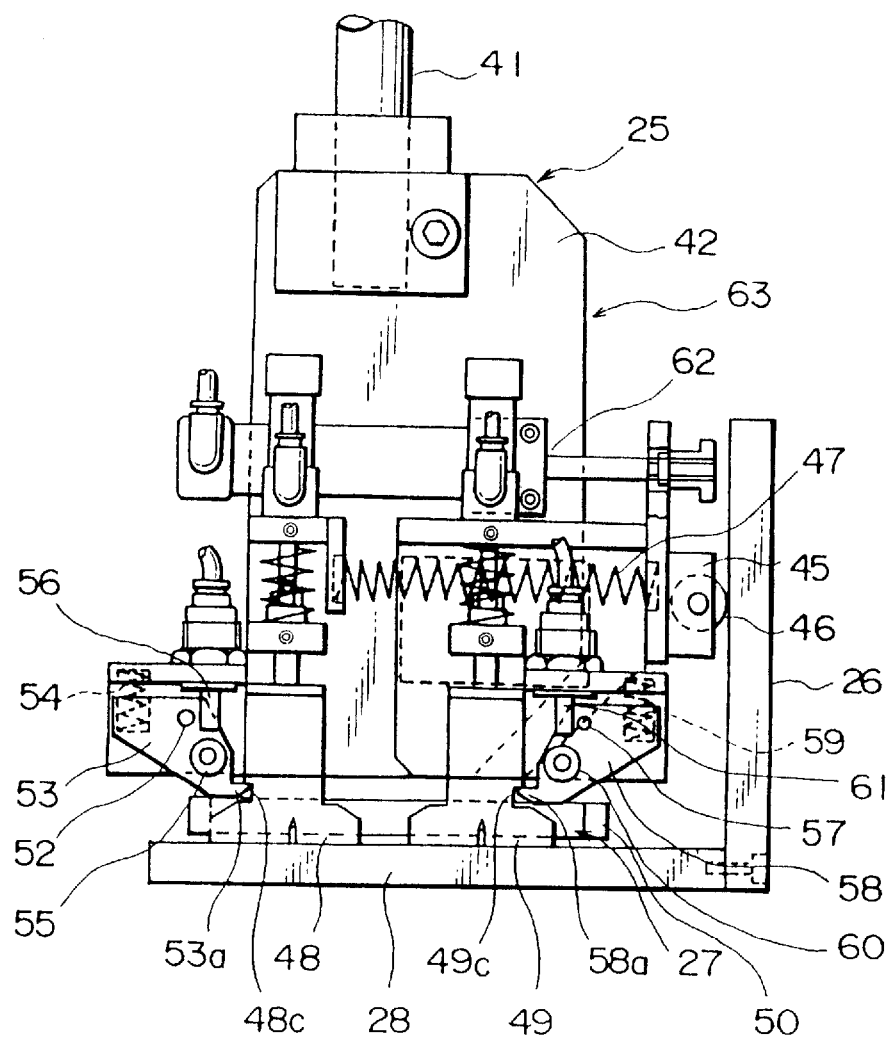
FIG. 15 is a structural view showing a lowered state of the mounting/demounting head of FIG. 14.
Figure 16:
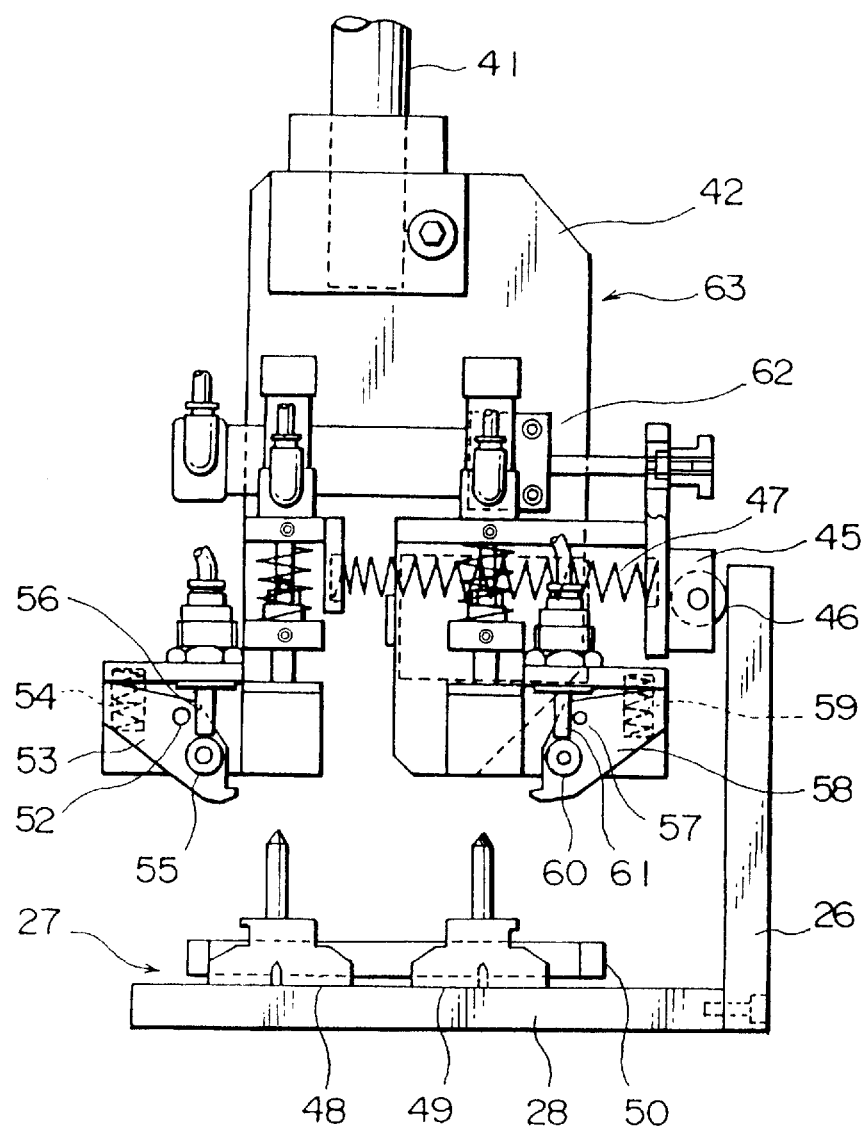
FIG. 16 is a structural view showing a released state of the centering unit of FIG. 15.
Figure 17:
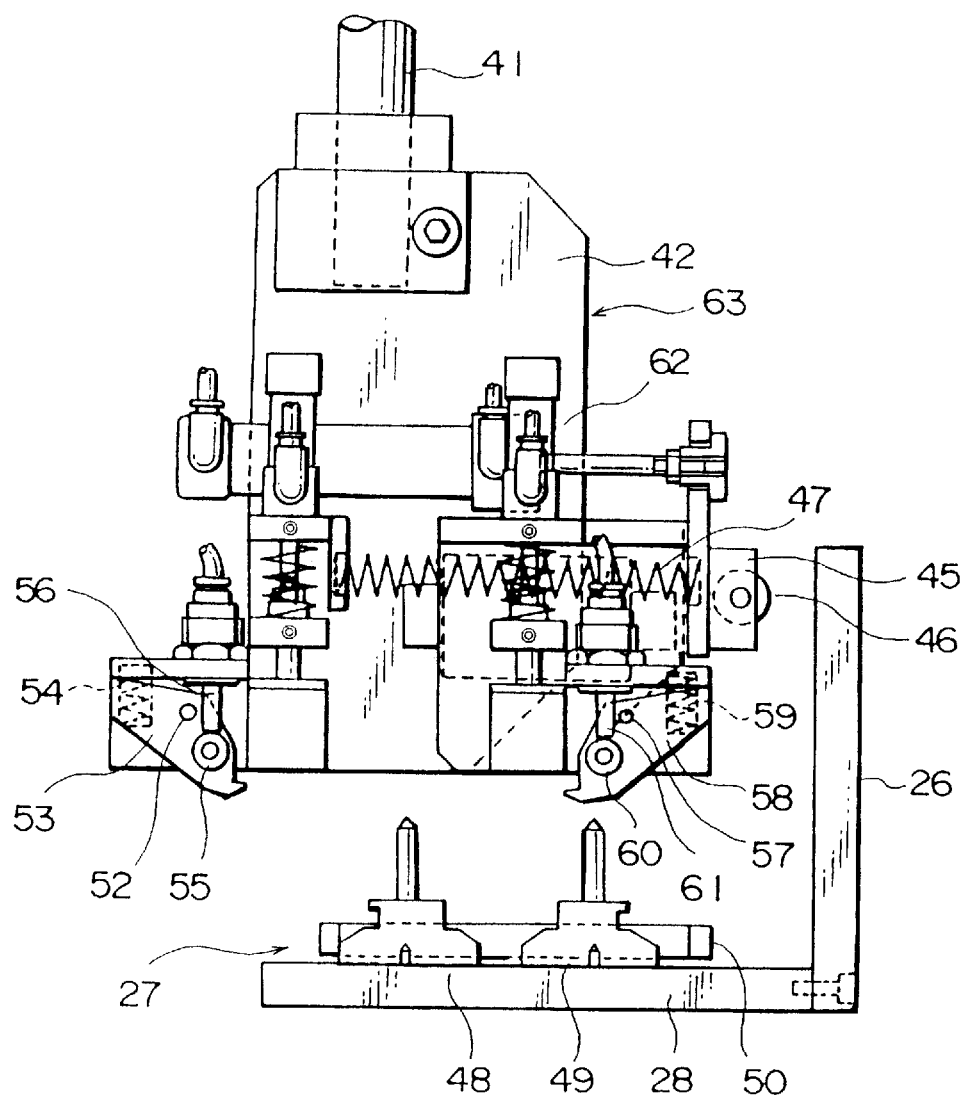
FIG. 17 is a structural view showing a state where the roller of FIG. 16 is separately opened with respect to the positioning member.
Figure 18:
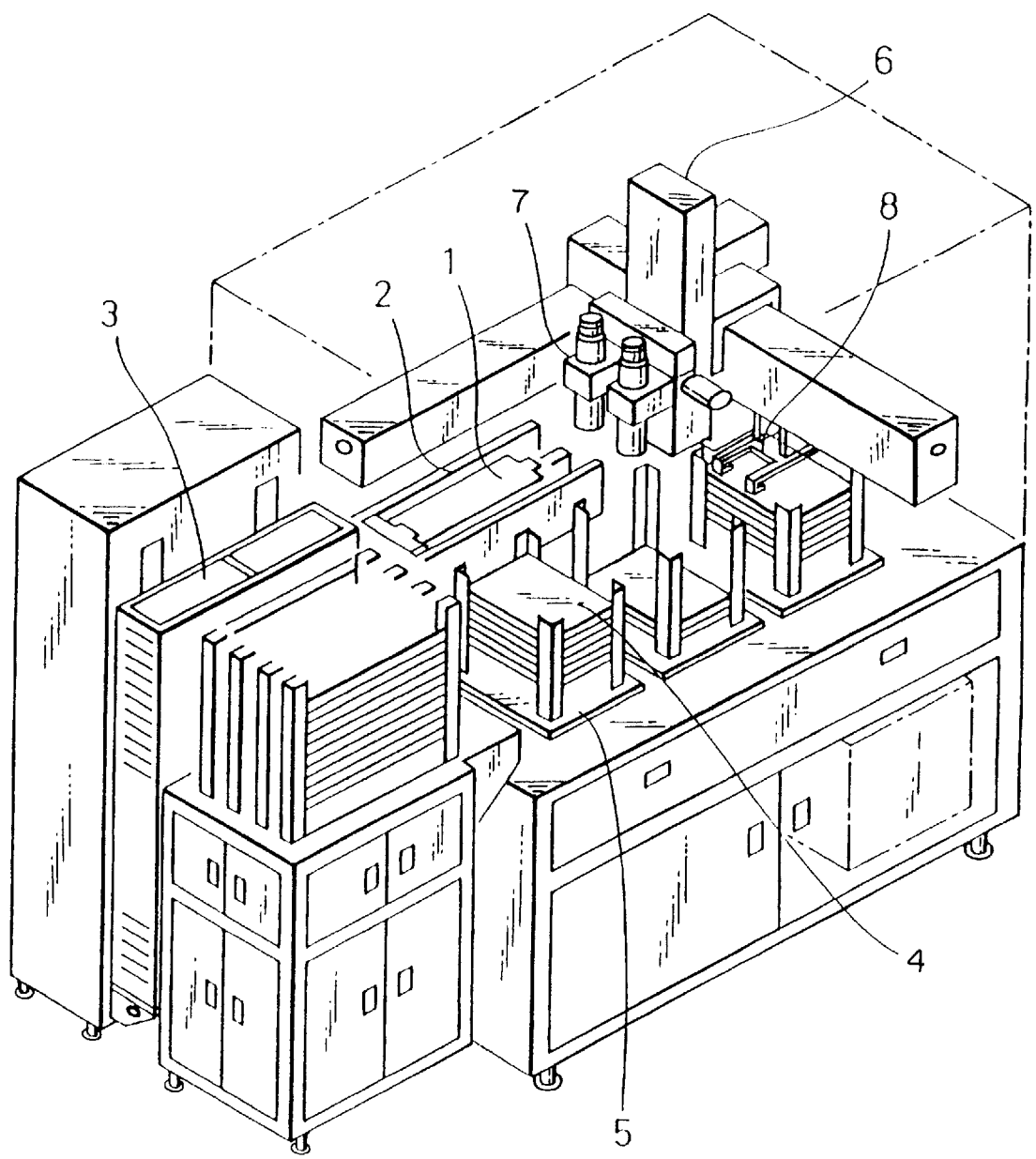
FIG. 18 is a perspective view showing one example of prior IC mounting/demounting systems.

After this, as shown in FIG. 15 the mounting/demounting head 25 is lowered until the centering unit 27 comes into contact with the top surface of the centering unit stocker 28. Further, through the operations of the air cylinders 56, 61, the levers 53, 58 are rotated against the springs 54, 59 and the chuck claws 53a, 58c are released from the engagement with the recess portions 48c, 49c of the centering tools 48, 49. In this state, as shown in FIG. 16 the mounting/demounting head 25 is moved upwardly to release the centering unit 27. Thereafter, as shown in FIG. 17 the mounting/demounting head 25 is shifted so that the roller 46 separates from the positioning member 26.

Thus, after the release of one centering unit 27, only the head body 63 is moved to above the centering unit stocker 28 holding another centering unit 27 and the centering unit 27 is set in the reverse procedure.

According to the IC mounting/demounting system equipped with this mounting/demounting head 25, since the replacement of the whole mounting/demounting head 25 is unnecessary irrespective of the change in size of the IC 13 to be handled and further since two IC's 13 can be sucked and held at one time, it is possible to save time in replacing the mounting/demounting head 25 and hence to sharply enhance working efficiency. In addition, the storage of IC 13 information in the control section 70 allows the automatic replacement of the centering unit 27, which further improves working efficiency.

Moreover, although the change in size of the IC 13 leads to the change in size of the IC socket 1A, since the socket pushers 48b, 49b having a size corresponding to the size of the IC 13 are formed in advance in the respective centering tools 48, 49, the simultaneous change in size of the IC socket 1A is possible with only the replacement of the centering unit 27 and the mounting/demounting head 25 can be simply constructed.

Furthermore, the levers 53, 58 are rotated through the air cylinders 56, 61 to release the chuck of the centering unit 27, and hence the mounting and demounting of the centering unit 27 can be done quickly in a small space.

Still further, the stopper 50 is provided in the centering unit 27, and the separation for the tray 4 is obtainable when the first and second centering tools 48, 49 are brought into contact with each other while the separation for the socket board 1 is attainable when the second centering tool 49 is placed into contact with the stopper 50, and therefore the positioning accuracy of the first and second centering tools 48, 49 is improved and the construction becomes simply.

Although the above-described example deals with the burn-in process, the system according to this invention is also applicable to the electrical operation test before and after the burn-in process if there is a need to mount and demount IC's to and from the IC socket.

What is claimed is:

1. An IC mounting/demounting system comprising:

a tray supply section for supplying a tray bearing a plurality of IC's;

a socket board supply section for supplying a socket board having a plurality of IC sockets to and from which said IC's can be mounted and demounted, each socket having a movable section which can be depressed to displace the movable section;

a robot body for carrying said IC's between said tray supplied to said tray supply section and said socket board supplied to said socket board supply section;

a mounting/demounting head including a head body supported by said robot body for holding one of said IC's by suction and a centering unit detachably supported by said head body for centering said one IC;

a centering unit stocker for bearing a plurality of centering units corresponding to said IC's having different sizes; and a control section for controlling an operation of said robot body, wherein said centering unit includes first and second centering tools each having a socket pusher for pressing said movable section and a centering recess portion for centering said one IC, said socket pusher being integrally constructed with said centering recess, and wherein a separation between said first and second centering tools is automatically switched between a first separation corresponding to an interval between said IC's on said tray and a second separation corresponding to an interval between said IC's on said socket board.

2. The IC mounting/demounting system as defined in claim 1, wherein said centering unit has a stopper for restricting said separation between said first and second centering tools to a larger of said first and second separations, while a smaller of said first and second separations is taken when said first centering tool is brought into contact with said second centering tool.

3. The IC mounting/demounting system as defined in claim 2, wherein said head body is equipped with a moving member made to move with said second centering tool, a tool biasing spring for bringing said second centering tool into contact with said first centering tool or for separating said second centering tool therefrom, and drive means for bringing said second centering tool into contact with said first centering tool against said tool biasing spring or for separating said second centering tool from said first centering tool.

4. The IC mounting/demounting system as defined in claim 3, wherein said centering unit stocker is provided with a positioning member for shifting said moving member to a position at which said centering unit can be mounted and demounted to and from said centering unit stocker against a force of said tool biasing spring in a manner that said head body is pressed against said positioning member.

5. The IC mounting/demounting system as defined in claim 1, wherein selection and replacement of one of said centering units corresponding to said one IC held by said head body are automatically conducted in a manner where information on the size of said one IC is input into said control section.

* * * * *